April 17, 1973 J. F. OSBORNE ET AL 3,728,176

METHOD OF CAUSING ADHERENCE OF GLASS TO GOLD

Filed April 30, 1971

INVENTOR
John Francis Osborne
BY Hans Joachim Pille
Mueller & Aichele
ATTY'S.

United States Patent Office 3,728,176

Patented Apr. 17, 1973

3,728,176

METHOD OF CAUSING ADHERENCE OF GLASS TO GOLD

John Francis Osborne, Tempe, and Hans Joachim Pille, Mesa, Ariz., assignors to Motorola, Inc., Franklin Park, Ill.

Filed Apr. 30, 1971, Ser. No. 139,051
Int. Cl. C23f *1/00*
U.S. Cl. 156—3 6 Claims

ABSTRACT OF THE DISCLOSURE

In Large Scale Integrated (LSI) technology, very complex circuits are manufactured which require at least two layer metallization patterns and often require three layers of metallization patterns in making all the interconnections among the transistors, diodes, resistors, etc. devices employed. Adjacent metallization layers are separated by silicon dioxide, $SiO_2$, phossil glass P-$SiO_2$ and other dielectric materials. Through connections between layers are made by opening apertures in the intervening dielectric material and forming the next layer of metal over the dielectric layer, which metal layer includes a member extending through the aperture and into contact with either an underlying layer of metal or the above mentioned devices themselves. When gold is selected as the metallization, an additional intermediate layer is now required for interfacing with the dielectric material since dielectric materials have not heretofore adhered directly to gold. The present invention is directed toward eliminating the need for this intermediate layer and having the dielectric material to adhere directly to the gold.

BACKGROUND

This invention relates to a method of applying a layer of a dielectric material such as glass to a gold electrical conductor or layer, without the need of an intermediate layer between the gold and the glass for obtaining a good bond between the layers.

While many situations exist where it is desirable to cause glass to adhere to gold, such as for example, to obtain decorative effects, an important situation of this nature is in the making of integrated semiconductive devices. In the production of such devices, a substrate of one conductivity type is provided, and by known diffusion methods various electronic devices such as transistors, resistors, P or N channel insulated gate field effect transistors, are provided in the surface of the substrate. In fact, several such elements are arranged for functioning as circuit entities, for example as a flip-flop circuit, as a gate circuit or as an amplifier to mention only a few thereof. To provide such circuits, connections are provided between the several elements for insuring operation in a desired manner, and furthermore, connections are provided between the terminals of the several devices for producing a function for the complete substrate, such as voltage regulators, memory circuits or any other such devices. In making the connections between the elements, and particularly, in making the connections between the devices themselves and between the devices and terminals of the unit or chip, many insulated crossings of the conductors take place. Furthermore, there should be no connections to the substrate except as necessitated by the design of the chip.

The connections are made by producing insulation on top of the chip except where connections to an element, which is part of a chip, is required. Then such electrical connections as can be made without crossings are provided between the exposed connections to the elements for providing a first layer of conductors. Then further insulation is put over the conductors and also between the conductors, and holes are provided in the further insulation where connections to the first layer of connectors are to be made. Then another layer of conductors is provided on the further layer of insulation, such as can be provided without crossovers, and the necessary connections to the first layers are made through the holes and this process is repeated. It is noted that the connections in one layer may cross another layer but each of these two layers are separated from each other by a layer of dielectric insulation. The complete structure has as many layers as is necessitated by the complexity of the several connections.

In providing a sturdy device for withstanding intermediate testing and further buildup of layers, the several layers should tightly adhere to each other. Other obvious requirements are that the insulation have low leakage when completed and that the conductors have high conductivity when completed. Furthermore, the material should withstand other process steps which may include heating to a high temperature and should withstand chemical and physical treatment. In addition, the structure should have physical and chemical stability whereby a chip which is satisfactory when completed will last a reasonable time. A well known insulating material that has the necessary properties is glass, $SiO_2$. This material will adhere very well to the substrate and to other glass, however, there are difficulties in making it adhere to suitable conductors. A suitable conductor to form the conductive connections of the conductive layer is gold. Gold has very high conductivity and high physical and chemical stability. However, in accordance with the prior art, glass will not adhere to it whereby one of several intermediate layers which cause glass to stick to gold are used. Provision of such an intermediate layer involves the step of providing the intermediate layer. Furthermore, the material of the intermediate layer may combine with the gold thereby increasing its resistance. The result is that using an intermediate layer requires the extra step of providing the intermediate layer. This extra step adds an unnecessary expense to the final device. Also, using the intermediate layer, care must be taken to prevent reducing the conduction of the gold.

It is an object of this invention to provide a method for adhering a layer of dielectric material directly to gold and yet form a bond between the layers.

It is a further object of this invention to cause dielectric material to adhere to gold directly without the necessity of one or more intermediate layers.

SUMMARY

In accordance with this invention, the surface of the gold is sufficiently roughened so that the dielectric material that is deposited on the gold as by chemical vapor deposition, sputtering or electron beam evaporation adheres mechanically to the rough surface of the gold. The roughening of the surface of the gold is provided by treating the gold with a cyanide persulfate solution which is obtained by mixing a 10% by weight aqueous solution of potassium cyanide with an equal amount of ammonium persulfate, the solution and the persulfate having a 1 to 1 volume ratio, and then mixing them thoroughly. The substrate having thereon the gold which is to have the dielectric material adhered thereto, is immersed in the cyanide persulfate solution for a short period of about 30 seconds. The gold as deposited on the chip by sputtering is relatively smooth having few cusps or rough spots. The cyanide persulfate solution attacks the grain boundaries of the gold of the layer and since the grains are very small, a very rough surface results greatly increasing the area of the gold surface. Then the chip is washed in deionized water, dried and the dielectric material deposited thereon in a known manner. The dielectric material enters the roughened surface of the gold and adheres thereto mechanically, that is, there is no chemical reaction or solid solubility between the gold and dielectric material, whereby the gold conductivity is not compromised. Suitable dielectric materials include $SiO_2$ or phossil glass or $Si_3N_4$.

DESCRIPTION

The invention will be better understood upon reading the following description in connection with the accompanying drawing in which.

Figure 1:
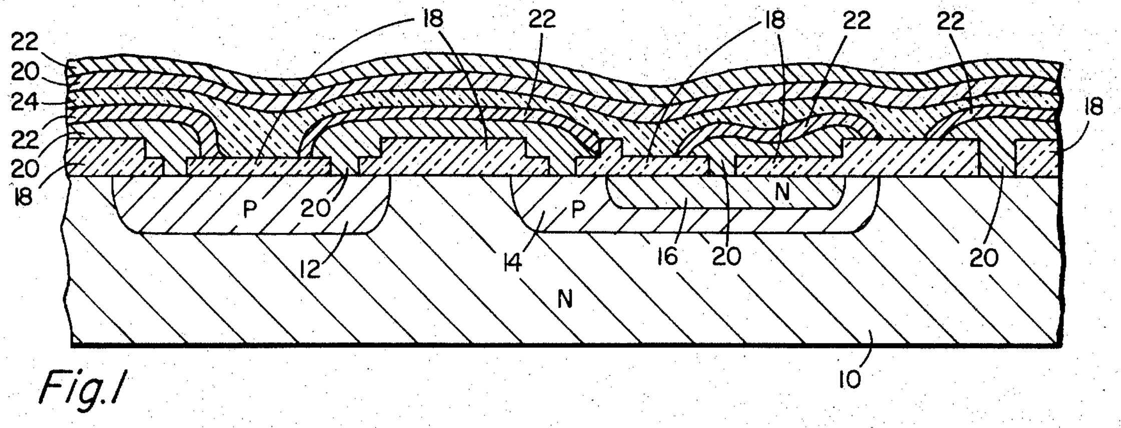
FIGS. 1–3 are useful in explaining the method of the present invention.

Turning first to FIG. 1, a substrate 10 of N-type monocrystalline silicon is provided. A P region 12 is diffused in a surface of the substrate 10 to form a resistor, and a P region 14 is also diffused into the surface to form the base of an NPN transistor. The collector of the NPN transistor is the substrate 10 and the emitter of the transistor is an N-type region 16 which is diffused into the base region 14. During the production of the device, as so far described, the $SiO_2$ layer 18 is provided. The process of producing the resistor 12 and the transistor 10, 14 and 16 and the layer 18 is well known and need not be described. Furthermore, the resistor 12 and the transistor 10, 14 and 16 are mere examples of many similar elements or different elements that may be provided in the substrate 10 is a known manner. Connections are made to the resistor 12, the collector 10, the emitter 16 and the base 14 also in a known manner. That is, tungsten 20 is deposited on the surface of the chip and through a hole in the layer 18 wherever a connection is to be provided. Gold 22 is then provided on the tungsten 20. The reason this is done is because gold is desired as the connector but gold wil not adhere to the $SiO_2$ 18 or to the exposed surface of the chip 10. However, tungsten adheres to the $SiO_2$ 18 and the exposed part of the substrate 10 and gold adheres to the tungsten. The method of causing the tungsten 20 to adhere to the $SiO_2$ 18 is any known method as by using one or more intermediate layers or the method of an application by the inventors of this case, Ser. No. 141,645, filing date May 10, 1971 and assigned to the asignee of this application may be used.

Figure 3:
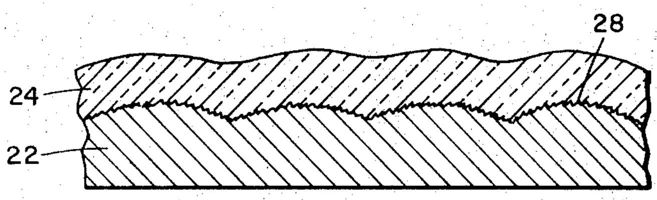
Figure 4:
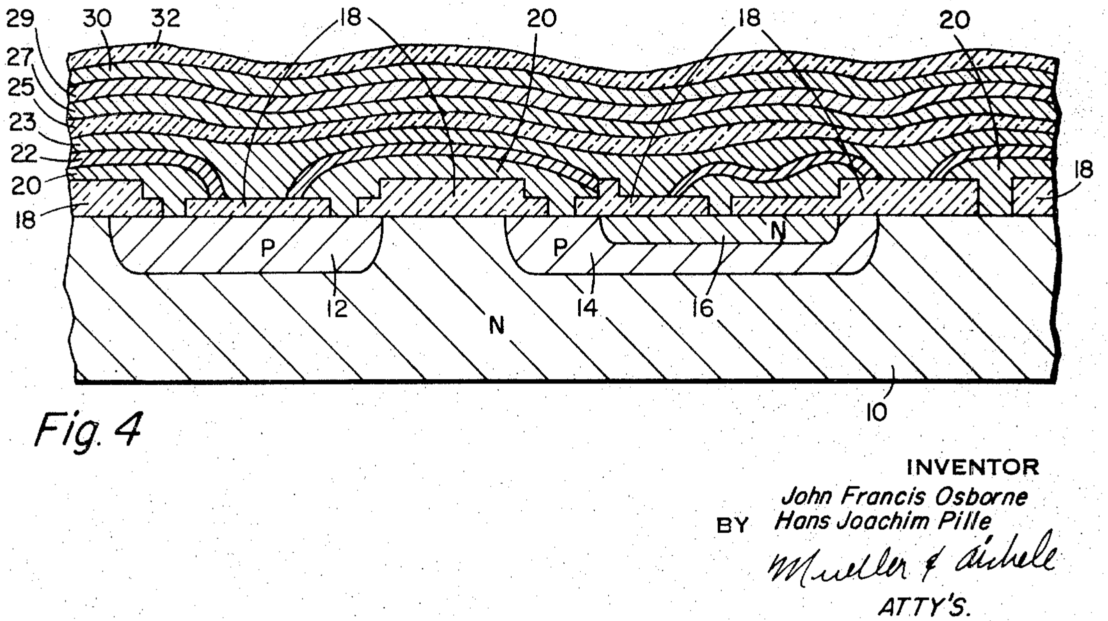
FIG. 4 illustrates a prior art method of adhering a dielectric to gold.

In accordance with the prior art method of providing insulation over the first layers 20 and 22 of connections, see FIG. 4, a layer 23 of material such as tungsten is deposited on the gold 22 and a layer of dielectric 25 is deposited on the tungsten. Then the next layer of conductors is put on the dielectric 25 as by first depositing an intermediate layer 27, such as tungsten, and then the next gold layer 29. Other layers, such as the tungsten layer 30 and the glass layer 32 are provided if required by the design of the device. However, in accordance with this invention, see FIG. 1, a dielectric layer 24 is deposited directly on the gold 22 and adheres thereto. This is accomplished first by dipping the substrate, after the deposition of the first gold layer 22 thereon and before any deposit is made on the gold layer 22, in a cyanide persulfate, solution, comprising about equal proportions of ammonium persulfate and a 10% by weight aqueous solution of potassium cyanide, and mixing thoroughly. The substrate is immersed in this cyanide persulfate solution for a short period of time such as 30 seconds. Then, the substrate is washed in deionized water and is dried. The substrate is then placed in a chamber to have a dielectric such as glass deposited thereon in a known manner. The methods of deposition include chemical, sputtering or electron beam evaporation as examples. The dielectric may be pure glass or phossil glass or silicon nitride ($Si_3N_4$), also as examples. The dielectric adheres mechanically to the gold as will be explained in more detail in connection with FIGS. 2 and 3.

Figure 2:
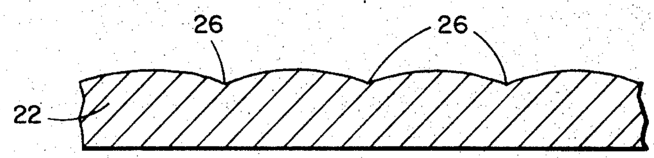

The surface of the gold 22 which is deposited on the tungsten 20 as by sputtering, is very smooth, see FIG. 2, having very few rough cusp like places 26 in the surface thereof. Since there is no chemical interaction between the gold and glass and since neither dissolves in the other, there is no mechanism for holding or bonding gold and glass together chemically. However, the cyanide persulfate solution, mentioned above, attacks the gold grain boundaries, that is the persulfate solution etches the surface of the gold so as to greatly increase the roughness thereof, as shown in FIG. 3 by the reference character 28. It will be noted that the roughness of the surface 28 of the gold 22 in FIG. 3, which has been etched by the persulfate solution, is much greater than in FIG. 2 before such persulfate etching. Then, when glass 24 is deposited on the gold 22 in a known deposition process, the mutual interface of the gold 22 and the glass 24 is very rough, providing mechanical bonding of the glass particles to the gold particles.

Therefore, returning to FIG. 1, when the gold 22 is deposited on the intermediate layer 20, the chip 10 is immersed in the persulfate solution, and washed as noted above, and the dielectric 24 is deposited directly thereon. The deposited dielectric 24 will also adhere to the portion of the glass 18 as exposed by the interstices in the gold 22. However, if another layer of gold 22 is deposited on the glass 24, the intermediate layer 20 is used between the dielectric layer 24 and the next higher gold layer 22. Therefore, by the disclosed method, a deposition step is avoided for each conductive layer that is to be deposited on the chip 10.

We claim:

1. The method of bonding a dielectric layer directly to gold comprising the steps of:
providing a member having an exposed gold surface;
etching said gold surface in a solution of equal parts by weight of ammonium persulfate and 10% by weight aqueous solution of potassium cyanide for providing roughened gold boundaries, and
forming a layer of dielectric material directly on said gold surface.

2. The invention of claim 1 in which said dielectric layer is glass.

3. The invention of claim 1 in which said dielectric layer is phossil glass.

4. The invention of claim 1 in which said dielectric layer is silicon nitride.

5. The invention of claim 1 in which the gold to which a glass is to be bonded is deposited on a semiconductive chip.

6. The invention of claim 5 in which said etching step comprises immersing said chip in the solution of equal parts by weight of ammonium cyanide and a 10% by weight aqueous solution of potassium persulfate for about thirty seconds.

References Cited

UNITED STATES PATENTS

| | | | |
|---|---|---|---|
| 1,954,403 | 4/1934 | Daly | 156—3 |
| 3,513,022 | 5/1970 | Casterline et al. | 117—212 |
| 3,585,064 | 6/1971 | Prosen | 117—17 X |
| 3,242,090 | 3/1966 | Grunwald | 156—18 X |
| 3,657,029 | 4/1972 | Fuller | 117—213 X |

WILLIAM A. POWELL, Primary Examiner

U.S. Cl. X.R.

117—49, 106; 156—18; 161—196